United States Patent [19]
Chen

[11] Patent Number: 4,678,552
[45] Date of Patent: Jul. 7, 1987

[54] SELECTIVE ELECTROLYTIC STRIPPING OF METAL COATINGS FROM BASE METAL SUBSTRATES

[75] Inventor: Johnson C. Chen, King of Prussia, Pa.

[73] Assignee: Pennwalt Corporation, Philadelphia, Pa.

[21] Appl. No.: 855,043

[22] Filed: Apr. 22, 1986

[51] Int. Cl.[4] .......... C25F 5/00
[52] U.S. Cl. .......... 204/146
[58] Field of Search .......... 204/146

[56] References Cited

U.S. PATENT DOCUMENTS 2,525,942 10/1950 Proell .......... 204/45
2,706,171 4/1955 Goral et al. .......... 204/56
3,649,489 3/1972 Dillenberg .......... 204/146
4,356,069 10/1982 Cunningham .......... 204/146
4,539,087 9/1985 Pojbics .......... 204/146

FOREIGN PATENT DOCUMENTS 0139039 5/1985 European Pat. Off. .......... 204/146

OTHER PUBLICATIONS

S. Sriveeraraghavan et al, "Anodic Stripping of Nickel From Copper or Brass", Met. Finishing, vol. 83, No. 10, pp. 41–43 (1985).

*Primary Examiner*—T. M. Tufariello

[57] ABSTRACT

Metal coatings are stripped from base-metal substrates in an electrolytic process employing an aqueous solution of alkanesulfonic acid of 1 to 4 carbons as the electrolyte at a concentration of from about 45 to about 70 weight percent, the coated base-metal substrate as the anode, and an electroconductive cathode, by impressing an electromotive force across the solution between the electrodes until the current decreases to zero which occurs when the metal coating on the anodic material is depleted and the base-metal substrate is left exposed.

7 Claims, No Drawings

SELECTIVE ELECTROLYTIC STRIPPING OF METAL COATINGS FROM BASE METAL SUBSTRATES

BACKGROUND OF THE INVENTION

This invention concerns the stripping of metal coatings from metal substrates such as copper, zinc, and their alloys. More particularly, it concerns the stripping of metal coatings (i.e., nickel, chromium, tin, lead, tin/lead alloy, cobalt, cadmium, or aluminum) in an electrolytic process employing an aqueous alkanesulfonic acid solution of 1 to 4 carbons as the electrolyte at a concentration of about 45 to about 70 weight percent.

Removal of metal coatings from metal substrates such as copper, zinc, and their alloys, is a common operation in metal finishing, either as a regular process step or as a remedial operation. For example, in printed circuit board manufacture, removal of solder resist is required as a standard procedure before precious metal is plated. In the manufacture of plumbing fixtures, defective electroplated nickel and chromium coatings need to be stripped and replated. In both cases, it is desired that the stripping process remove only the coating and leave the substrate intact and easily prepared for the next process step. The removal can be accomplished either by chemical immersion, usually in strong acid solutions, or by electrolytic stripping.

In chemical immersion, the workpiece is immersed in a solution formulated to remove the coating and leave the base metal coating free of corrosion until such time as the metal coating is completely removed. In electrolytic stripping, which is much faster, the work piece serves as the anode in an electrolytic bath through which a dc voltage is applied to remove the metal coating. Since the metal coatings are usually not uniform in thickness throughout the surface of the workpiece, it requires different lengths of time to remove the coating from different areas of the surface. Some portions of the substrate will be exposed to the electrolytic environment earlier than other portions and the earlier exposed surface would tend to be corroded unless the base metal is inert to the stripping solution. In order to prevent such unwanted corrosion, it is customary to add inhibitors. The function of the inhibitor is to prevent dissolution of the base metal in the electrolyte. The addition of inhibitor increases the complexity of the stripping process and may result in complicated procedures for maintaining the proper bath composition. Because of the toxic nature of many inhibitors, waste disposal often becomes a problem. Examples of commonly-used inhibitors that are toxic, are thioureas and chromic acid. Usually the formulations employed are very specific and will serve to strip only certain types of metal coatings from specific substrates. If an improper formulation is used, either no stripping will occur, or the substrate will be damaged by corrosion. A general method to strip several different metals from diversified substrates is therefore highly desirable.

Stripping metal coatings such as nickel, chromium, tin, lead, and tin/lead alloys from industrially-important, but easily-corroded, base-metal substrates such as copper, zinc, and their alloys, to provide a clean substrate surface, has been difficult to accomplish. Generally, additives are incorporated into the formulation to coat and protect the substrate surface. These additives must then be removed to provide the clean, non-corroded substrate surface required for further processing or refinishing. This requires adding an additional processing step and adds to cost.

STATEMENT OF THE INVENTION

This invention is a process for selective electrolytic stripping of metal coatings selected from nickel, chromium, tin, lead, tin/lead alloy, cobalt, cadmium, aluminium or mixtures thereof from a base-metal substrate selected from copper and its alloys and zinc and its alloys consisting essentially of immersing said coated base-metal substrate into an aqueous electrolyte solution of from about 45 to about 70 weight percent of an alkanesulfonic acid of 1 to 4 carbons wherein said coated metal-base substrate is the anode and an electroconductive material is the cathode, impressing a direct current voltage across said electrolyte solution between the electrodes until the current decreases to zero which occurs when the metal coating on the anode is completely stripped off leaving the base-metal substrate exposed.

DETAILED DESCRIPTION OF INVENTION

This invention is a hydrometallurgical process for removing metal coatings from metal coated base-metal substrates such as printed circuit boards or plumbing fixtures. The process employs an aqueous solution of an alkanesulfonic acid having carbon chain lengths of 1 to 4 as the electrolyte. Such sulfonic acids include, for example, methanesulfonic acid, ethanesulfonic acid, propanesulfonic acid, isopropanesulfonic acid, butanesulfonic acid, and isobutanesulfonic acid. The preferred sulfonic acid is methanesulfonic acid (MSA) because of its availability, low molecular weight, high innate solubility in water and high water solubility of its metal salts. The alkanesulfonic acid is employed at a concentration of from about 45% up to about 70% based on the weight of the electrolyte solution. Preferably, the alkanesulfonic acid is used in the electrolyte solution at a concentration of from about 50 to about 65%. It has been unexpectedly found that active metals such as copper or zinc when used as the anode in an electrolyte bath containing the alkanesulfonic acid in the above noted ranges are relatively inert to the acid. In other words, when the coatings have been completely removed from these metals, the alkanesulfonic acid solution does not appreciably dissolve (or corrode) these metals; the current dwindles to zero quickly. Upon further examination, a thin layer of insulating film is found on the surface of these bare metals. When the bare base-substrate piece is rinsed with water to remove the insulating film, and again subjected to similar electrolytical reaction, the current again diminishes to zero in a matter of a split second.

The electromotive force impressed on the electrolytic system is a direct current (dc) voltage ranging from about 1 to about 20 volts resulting in the metal coating on the anode being dissolved into the electrolyte solution. The dissolved metal may (but not necessarily) plate out on the cathode. The optimum voltage for maximum current efficiency in this process ranges from about 1 to about 20 volts with the use of aqueous methanesulfonic acid as the electrolyte.

The anode for the process of this invention is a base-metal substrate of copper and its alloys and zinc and its alloys coated with a metal such as chromium, nickel, tin, lead, tin/lead alloy, cobalt, cadmium, or aluminum. Since many electroplated industrial products are based on copper, zinc, or brass based metals, or other metals or plastic coated with copper, this invention is especially useful for stripping applications, either for normal manufacturing procedures or as a remedial operation.

The industries that can benefit from this invention are the manufacture of printed circuit boards, plumbing fixtures, and electroplated plastics, especially automotive parts. For printed circuit boards, this invention provides an ideal method for stripping solder from the printed circuitry. The stripping is quick and efficient and the unwanted solder can be stripped within 2 minutes. The stripped metal, deposited on the cathode, is recoverable. In plumbing-fixture manufacture, it is sometimes necessary to remove the chromium and/or nickel coatings so the parts can be reprocessed and refinished. The process of this invention can remove the coatings quickly and effectively without damaging the brass or zinc die castings. Electroplated automotive parts are usually copper undercoated. The defective parts are usually discarded because of a lack of suitable methods to remove the coating without damaging the plastic base. With the application of this invention, however, the chromium and nickel plating can be stripped and the copper undercoating left intact. This not only saves the valuable plastic parts, it also saves the copper undercoating, which requires a cumbersome process to apply.

The cathode of this invention may be any electroconductive material in any desired shape which is substantially insoluble in the electrolyte under the conditions of the process. Typical cathode materials are stainless steel and graphite, preferably fabricated in a flat shape.

The temperature at which this process is operated is not critical. Preferably, it is carried out at ambient temperature although, due to a moderate exotherm during operation, the temperature may rise. The temperatures generally may range from ambient to about 100° C., normally 40°-50° C., and external cooling is typically not required.

The electrolytic cell of this invention includes a tank or vessel of a suitable size and shape in which the electrolytic process may be operated in the desired fashion. The material from which the tank is fabricated may be nonelectrically conductive or electrically conductive, if properly insulated, as is well known in this art.

EXAMPLE I

A copper coupon measuring 7.63 cm×1.22 cm×0.32 cm plated with solder of about 50/50 tin-lead was anodically electrolyzed at 7.6 volts in a 50% methanesulfonic acid (MSA) solution using a stainless steel coupon as cathode. The initial current was 10 amps, which went down as time progressed. When the current went to zero, the copper surface had no solder left on it. The copper coupon was rinsed with water to give a fresh-looking copper surface.

EXAMPLE II

Stripping of chromium and nickel from a typical plumbing fixture is illustrated. A piece of zinc die-cast faucet housing with copper underplate was used as anode and electrolyzed in a 65% MSA bath using a stainless steel plate as cathode. The voltage used was 7.6 volts. After about 25 minutes, the piece was free of nickel plating. When rinsed with water, red copper appeared on the entire housing surface.

EXPERIMENT A

This experiment illustrates the rate of corrosion of copper in methanesulfonic acid at various concentrations.

Copper coupons of known weight and measuring 7.65 cm×2.54 cm×0.08 cm were electrolyzed in methanesulfonic acid solutions of 20, 40, 50, 60 and 70% by weight. The copper anodes were immersed about 4.6 cm into the MSA solutions and a stainless steel coupon measuring 7.65 cm×2.54 cm×0.08 cm with 4.6 cm immersion was used as the cathode. After electrolysis, the samples were rinsed in water, dried and weighed. The results are shown in Table 1.

TABLE 1

| MSA Solution | Copper Coupon Wt. (g) | | Time | |
|---|---|---|---|---|
| (wt. %) | Initial | After Electrolysis | (min) | % Loss |
| 20 | 25.2590 | 24.7845 | 2 | 1.88% |
| 40 | 25.8113 | 23.0850 | 60 | 10.56% |
| 50 | 26.1550 | 26.1257 | 60 | 0.11% |
| 60 | 26.7705 | 26.7649 | 60 | 0.021% |
| 70 | 25.0585 | 25.0560 | 60 | 0.01% |

This illustrates that the rate of corrosion is a function of the MSA concentration.

What is claimed is:

1. A process for the selective electrolytic stripping of metal coatings selected from nickel, chromium, tin, lead, tin/lead alloy, cobalt, cadmium, aluminum, or mixtures thereof from a base-metal substrate selected from copper and its alloys and zinc and its alloys consisting essentially of immersing said coated base-metal substrate into an aqueous electrolyte solution of from about 45 to about 70 weight percent of an alkanesulfonic acid of 1 to 4 carbons wherein said coated metal-base substrate is the anode and an electroconductive material is the cathode, impressing a direct current voltage across said electrolyte solution between the electrodes until the current decreases to about zero which occurs when the metal coating on the anode is completely stripped off leaving the base-metal substrate exposed.

2. The process of claim 1 wherein the alkanesulfonic acid is methanesulfonic acid.

3. The process of claim 2 wherein the concentration of methanesulfonic acid is from about 50 to about 65%.

4. The process of claim 3 wherein said direct current voltage is in the range of from about 1 to about 20.

5. The process of claim 4 wherein said anode is coated with nickel or chromium.

6. The process of claim 4 wherein said anode is coated with tin, lead, or tin/lead alloys.

7. The process of claim 4 wherein said anode is coated with cobalt, cadmium, aluminum, or mixtures thereof.

* * * * *